Feb. 11, 1969 H. H. A. BATH 3,427,568
TRANSISTORISED OSCILLATORS
Filed Jan. 30, 1967
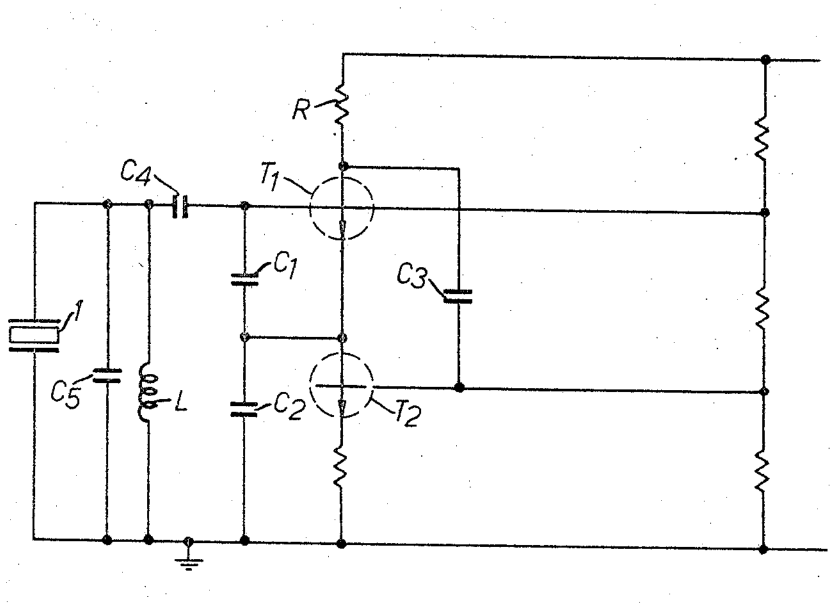
HUGH HENRY ANTHONY BATH
INVENTOR
BY Hall & Houghton
ATTORNEY 3,427,568

TRANSISTORISED OSCILLATORS

Hugh Henry Anthony Bath, Reigate, Surrey, England, assignor to Edwards High Vacuum International Limited, Crawley, Sussex, England, a British company Filed Jan. 30, 1967, Ser. No. 612,580
U.S. Cl. 331—116 4 Claims
Int. Cl. H03b 5/36

ABSTRACT OF THE DISCLOSURE

An oscillator having a piezo-electric crystal in its resonant circuit for use in conjunction with a monitoring device in vacuum deposition apparatus, in which a transistor oscillator has a constant current generator in the form of a further transistor in its emitter-collector circuit to increase the gain of the transistor oscillator. Feedback is provided between the collector of the oscillator transistor and the base of the further transistor to ensure stability and the crystal may be protected by being shunted by a path of low impedance to frequencies outside the design range of the oscillator.

This invention relates to transistorised oscillators and particularly, though not exclusively, to such oscillators when used in apparatus for monitoring the deposition of thin film under vacuum.

It is known in monitoring devices for vacuum deposition apparatus to provide an oscillator having a piezo-electric crystal in its resonant circuit. The crystal is exposed to material being deposited in a vacuum system so that the mass deposited on the crystal is representative of that on a workpiece. It is an object of the invention to provide an oscillator with an improved gain and stability over known simple oscillators of the basic Colpitts type. It is a further and subsidiary object to provide for protection of the oscillator components from harmful or undesirable effects which arise when the crystal is subject to space charges or plasmas in vacuum deposition apparatus.

The present invention provides a transistorised oscillator having an oscillator transistor, an auxiliary transistor with its collector directly coupled to the emitter of the oscillator transistor, a resistor connected between the emitter of the oscillator transistor and earth, a first capacitor connected between the collector of the oscillator transistor and the base of the auxiliary transistor, and a parallel resonant circuit having a first limb and a second limb, said first limb comprising a piezo-electric crystal connected between the base of the oscillator transistor and earth, which said crystal is shunted by an inductor and a second capacitor, and said second limb comprising a third capacitor and a fourth capacitor connected in series between the base of the oscillator transistor and earth, the junction point of said third and fourth capacitors being coupled to the emitter of said oscillator transistor.

The provision of the constant current generator serves to increase the feedback of the oscillator transistor, but this is further increased by the capacitative feedback path provided between the collector of the oscillator transistor and the base of the auxiliary transistor.

In certain applications when the crystal is being used as part of a monitor apparatus for the deposition of thin films under vacuum and when the deposition process involves sputtering or electron bombardment of bulk material from which the films are to be processed, the generation of fluctuating high and low density space charges and plasmas is inevitable. Thus the crystal is shunted across its electrodes by a low impedance leakage path, including an inductor. The leakage path is a capacitor and an inductor connected in parallel so as to provide a low impedance path for all frequencies outside the range of resonant frequencies of the crystal during use.

An embodiment of the invention will now be described with reference to the accompanying drawing which shows in circuit form a transistorised oscillator for use in apparatus for monitoring the deposition of thin films under vacuum.

Reference 1 indicates an AT cut quartz crystal which is exposed to the interior of a thin film deposition apparatus, the resonant frequency of the crystal depending upon the mass of the thin film deposited thereon. One electrode of crystal 1 is grounded to earth line 2. $T_1$ is an oscillator transistor provided with a resonant circuit including crystal 1 and capacitors $C_1$ and $C_2$, feedback from the base to the emitter of transistor $T_1$ being provided by connecting a centre tap between capacitors $C_1$ and $C_2$ to the emitter of $T_1$. A second transistor $T_2$ is connected in a circuit between the emitter of $T_1$ and the grounded line 2 of the oscillator. This second transistor acts as a constant current generator, having its high impedance collector side connected to the emitter of transistor $T_1$, and it serves to increase the feedback of transistor $T_1$, both transistors being of the high frequency type. Feedback is provided between the collector of transistor $T_1$ and the base of transistor $T_2$ by means of capacitor $C_3$. Thus by matching the effective internal emitter resistance of transistor $T_1$ with the resistor R, the feedback through capacitor $C_3$ can be arranged to ensure oscillation for crystals having a wide range of activities.

When the crystal is subjected to space charges and plasmas as already outlined, the electrons and ions may be attracted to any grounded point in the apparatus of the vacuum system, and this includes the crystal monitor 1 and, through the various electrical connections, the remainder of the oscillator circuit and any other electrical components associated with it. As these circuits often include semi-conductor devices, such as diodes or transistors, it is important that energies due to the space charge or plasma find a suitable path to earth outside the active part of the oscillator i.e., the device which provides the energy for exciting oscillations in the crystal. As these circuit paths will include the exposed electrode of the crystal which will itself form a part of the circuit due to its own resistance it is important that this electrode is as near ground potential as possible. In other words there must be provided a leakage path to ground that will offer only a very low resistance to any direct currents caused by any space charge or plasma and which could otherwise cause either permanent damage to the active devices or an upset to the associated circuits necessary to provide a consistent reading of film mass. Thus the exposed electrode of crystal 1 is provided with a leakage path through inductor L to grounded line 2. The inductor L has an inductance of high Q value within the frequency band of the crystal so as to maintain the crystal face at near ground potential when the space charge seeks to build up. A capacitor $C_4$ connected to the base of transistor $T_1$ and having a high impedance to direct current and low frequencies in the range 1–10 mc./s. will serve to protect the active devices, but the inclusion of the inductor L is still necessary as the currents caused by the space charge can build up quite rapidly on the exposed crystal face. However, in the event of highly concentrated space charges and plasmas, it is still possible for the electrode potential to be raised at such as rate that the capacitor $C_4$ and the inductor L give insufficient protection. In this case a capacitor $C_5$ is placed in parallel with inductor L so that the shunt leakage path can be arranged to offer a low impedance to all frequencies other than those in the range over which the resonant frequency of the crystal 1 is shifted during use.

The oscillator described has an improved gain and stability, yet is protected from harmful or undesirable effects arising from space charging or plasmas when used for monitoring thin films.

I claim:

1. A transistorised oscillator including in combination:
(a) an oscillator transistor,
(b) a resonant circuit including a piezo-electric crystal connected for parallel resonance between the base electrode of said oscillator transistor and earth, said circuit including a first capacitor connected between said base electrode of said oscillator transistor and the emitter of said oscillator transistor.
(c) a circuit connected begtween the emitter of said oscillator transistor and earth, said circuit including an auxiliary transistor whose collector is directly coupled to said emitter of said oscillator transistor and which said auxiliary transistor serves as a constant current generator driving said oscillator transistor, and
(d) a second capacitor connected between the collector of said oscillator transistor and the base of said auxiliary transistor.

2. A transistorised oscillator according to claim 1 in which said crystal has a resonant frequency which may vary within a limited range and is shunted by a path of low impedance to all frequencies outside said range of frequencies.

3. A transistorised oscillator according to claim 2 in which said path of low impedance comprises a third capacitor and an inductor connected in parallel.

4. A transistorised oscillator including in combination
(a) an oscillator transistor, (b) an auxiliary transistor having its collector directly coupled to the emitter of said oscillator transistor,
(c) a resistor connected between the emitter of said auxiliary transistor and earth,
(d) a first capacitor connected between the collector of said oscillator transistor and the base of said auxiliary transistor, and
(e) a parallel resonance circuit having a first limb and a second limb, said first limb comprising a piezo-electric crystal shunted both by a second capacitor and an inductor, which said crystal is connected between the base of said oscillator transistor and earth, and said second limb comprising a third capacitor and a fourth capacitor connected in series between the base of said oscillator transistor and earth, and in which the junction between said third capacitor and said fourth capacitor is coupled to the emitter of said oscillator transistor.

References Cited

UNITED STATES PATENTS

| | | | |
|---|---|---|---|
| 2,741,700 | 4/1956 | Hall | 331—164 |
| 2,930,002 | 3/1960 | Edwards et al. | 331—116 |
| 3,076,945 | 2/1963 | Coombs | 331—117 |
| 3,213,390 | 10/1965 | Faith et al. | 331—116 |
| 3,254,314 | 5/1966 | Healey | 331—168 |

JOHN KOMINSKI, *Primary Examiner.*

U.S. Cl. X.R.

331—159